US006118069A

United States Patent [19]

Tamura et al.

[11] Patent Number: 6,118,069

[45] **Date of Patent: *Sep. 12, 2000**

[54] SHIELDED CASING

[75] Inventors: Nobuo Tamura; Takeshi Saito; Junichi Noro, all of Akita, Japan

[73] Assignee: Mitsumi Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/141,420

[22] Filed: Aug. 27, 1998

[30] Foreign Application Priority Data

Aug. 29, 1997 [JP] Japan .................................... 9-249996

[51] Int. Cl.[7] ....................................................... H05K 9/00

[52] U.S. Cl. ................... 174/35 R; 174/35 C; 174/35 R; 174/36; 174/37; 174/51; 174/52.1; 339/126 RS

[58] Field of Search ............................... 174/35 C, 35 R, 174/36, 37, 51, 52.1, 60, 64, 65 R; 339/126 RS

[56] References Cited

U.S. PATENT DOCUMENTS

| 4,818,895 | 4/1989 | Kaufman | 307/303.1 |
|---|---|---|---|
| 5,281,762 | 1/1994 | Long et al. | 174/78 |

*Primary Examiner*—William A. Cuchlinski, Jr.
*Assistant Examiner*—Ronnie Mancho
*Attorney, Agent, or Firm*—McGuire, Woods, Battle & Boothe, LLP

[57] ABSTRACT

A shield casing including a metal shield casing body covering a circuit board to which a electrical cable is connected, the shield casing body including a top portion, side walls and an opened bottom portion, a cable introduction portion formed by partly notching one of the side walls, the electrical cable being introduced into the cable introduction portion in parallel with the top portion, and a contact piece extending perpendicularly from the top portion towards the bottom portion and positioned above the cable introduction portion, the electrical cable being welded on the contact portion by soldering.

10 Claims, 4 Drawing Sheets

15 11 43 16 20 21 14

SHIELDED CASING

BACKGROUND OF THE INVENTION

1. Technical Field of the Invention

The present invention relates to a shield casing with a contact piece which is soldered to the grounded part of a cable introduced in the casing.

2. Description of the Related Art

GPS (global positioning system) antenna unit is popularly employed as a positioning system. The GPS antenna for use with the GPS includes a printed circuit board with metal casing and high frequency circuit elements for processing high frequency signals. A coaxial cable is mounted to the GPS antenna such that the high frequency signals are transmitted through the coaxial cable from the high frequency circuit elements.

The GPS comprises: a GPS antenna for receiving radio waves from satellites; a high frequency circuit which subjects a high frequency signal received through the GPS antenna to noise elimination, amplification, frequency conversion, etc.; and a central processing circuit (CPU) which processes the signal which has been frequency-converted by the high frequency circuit. The GPS antenna is connected to the high frequency circuit through a coaxial cable such that only a small loss in the signal is sacrificed.

The high frequency circuit is covered with a shield structure so that it may not affect electronic equipment therearound. More specifically, the printed circuit board, on which the components of the high frequency circuit are mounted, is covered with a metal shield casing, and the latter is connected to the grounded (shielded) part of the coaxial cable. The connection of the metal shield casing to the grounded part of the coaxial cable is often achieved by soldering.

The parts FIGS. 3(A) and 3(B) are plan views showing a part of a conventional shield casing. FIG. 3(A) is a plan view showing a shield casing only. In the figure, reference numeral 11 denotes a casing body; and 12, a soldering contact piece formed by cutting the end portion of the casing body 11. FIG. 3(B) shows the grounded part 21 of a coaxial cable 20 set under the contact piece 12.

FIGS. 4(A) and 4(B) are side views showing a part of the conventional shielding casing. As shown in FIG. 4(A), the coaxial cable 20 has an insulating cover 22 inside the grounded part 21, and a central conductor 23 inside the insulating cover 22. The central conductor 23 is soldered to the conductor pattern of a printed circuit board 30. Further in FIG. 4(B), reference numeral 41 denotes a solder. The grounded part 21 is soldered to the contact piece 12 of the casing body 11. The reference numeral 42 also denotes the solder used for this soldering operation.

In the conventional shield casing shown in FIGS. 3 and 4, the contact piece 12 is flush with the casing body 11 immediately after the punching of a metal plate as shown in FIG. 3. After the contact piece 12 is bent towards the grounded part 21 in a proper angle, the contact piece 12 is welded to the latter 21 by soldering. Hence, the shield casing assembling process includes a step of bending the contact piece; that is, the number of manufacturing steps is increased as much. This is the problem to be solved by the invention.

SUMMARY OF THE INVENTION

It is therefore the first object of the invention to provide a shield casing which is so designed a soldering contact piece thereof is formed merely by forming a shield casing body by punching, and the shielding soldering can be achieved without the bending of the contact piece.

Further, the second object of the invention is to provide a shield casing whose structure is such that shielding solder therein does not stick out of the casing body.

To achieve the above objects, there is provided a shield casing comprising: a metal shield casing body covering a circuit board to which an electrical cable is connected, the shield casing body including a top portion, side walls and an opened bottom portion; a cable introduction portion formed by partly notching one of the side walls, the electrical cable being introduced into the cable introduction portion in parallel with the top portion; and a contact piece extending perpendicularly from the top portion towards the bottom portion and positioned above the cable introduction portion, the electrical cable being welded on the contact portion by soldering.

In the casing, an arcuate notch is formed at an end portion of the contact piece so as to be along an outer face of the electrical cable.

Hence, the contact piece can be soldered to the cable without being bent and introduced into the cable introduction portion in such a manner that the cable is in parallel with the top portion.

In the casing, the contact piece is positioned inwards in the casing than an outer face of the side wall in which the cable introduction portion is formed.

Hence, the shielding solder does not stick out of the casing.

DETAILED DESCRIPTION OF THE PREFERRED EMBODIMENT

Figure 1A:
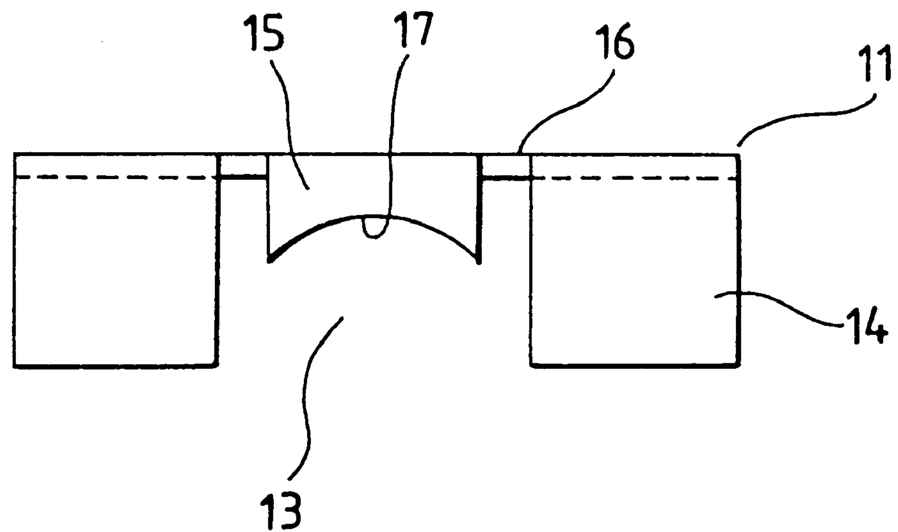
FIGS. 1(A) and 1(B) are side views showing one embodiment of a shield casing according to the present invention.
Figure 1B:
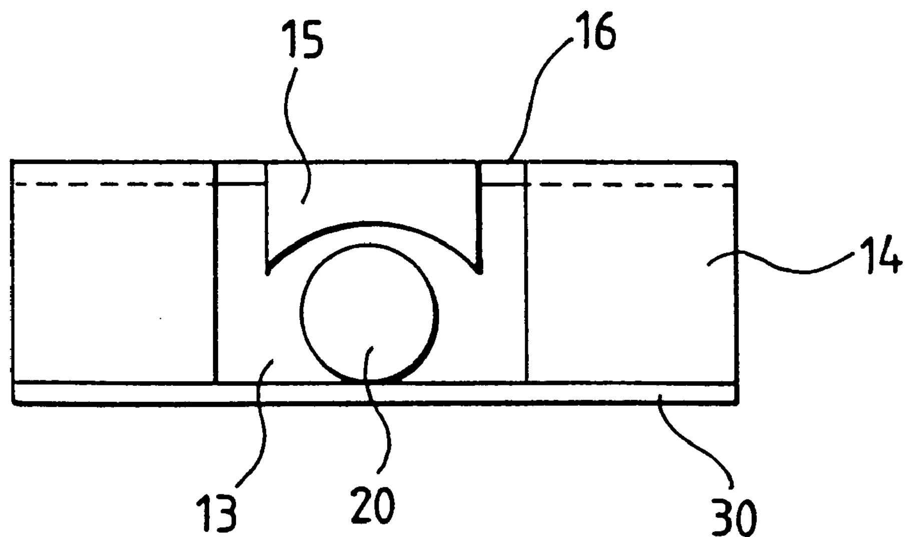
Figure 2A:
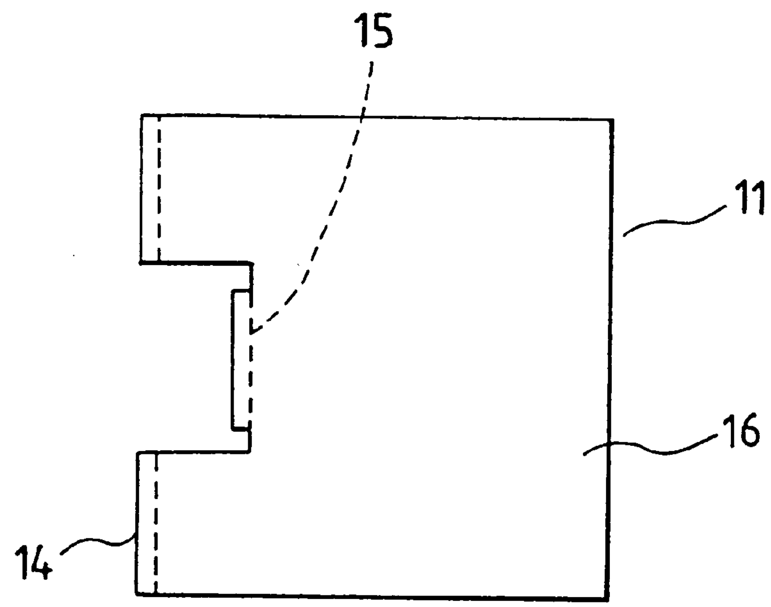
FIGS. 2(A) and 2(B) are plan views of the shield casing shown in FIGS. 1(A) and 1(B), respectively.
Figure 2B:
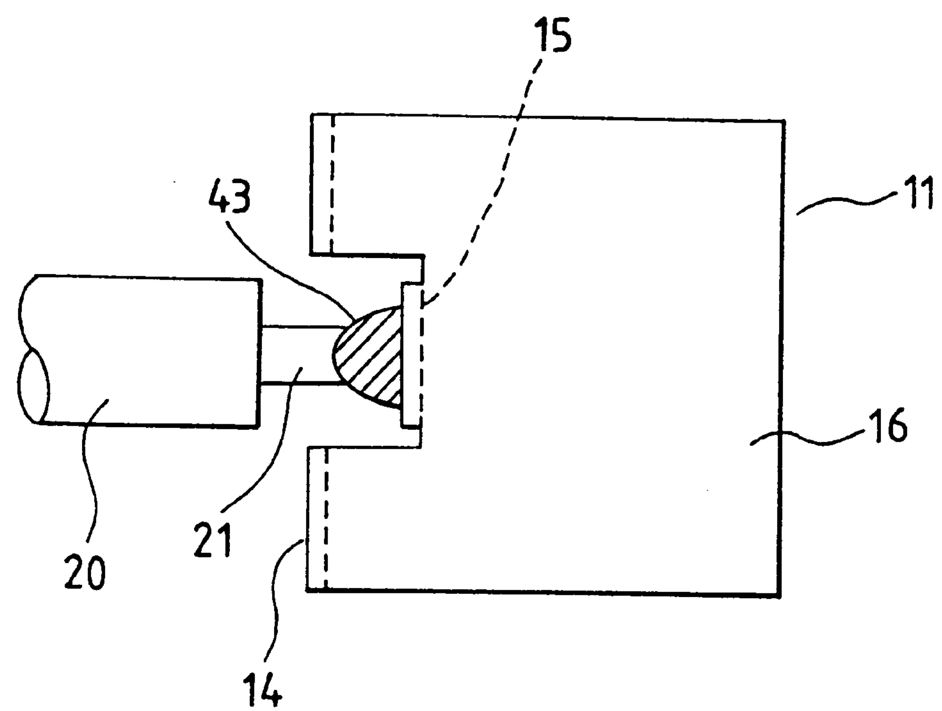
Figure 3A:
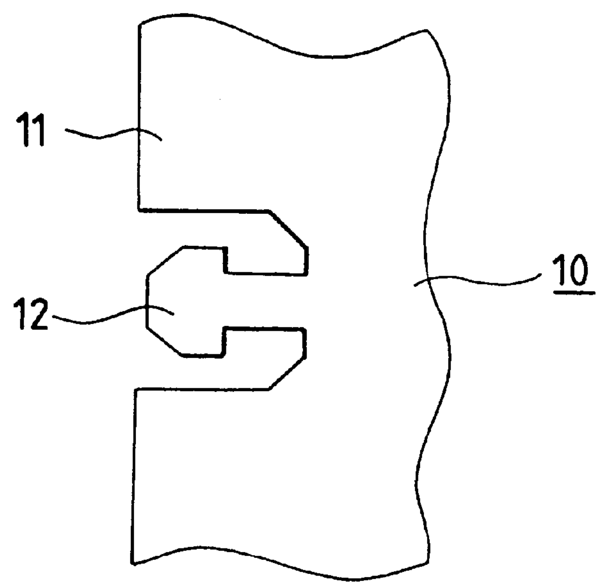
FIGS. 3(A) and 3(B) are plan views showing a conventional shield casing.
Figure 3B:
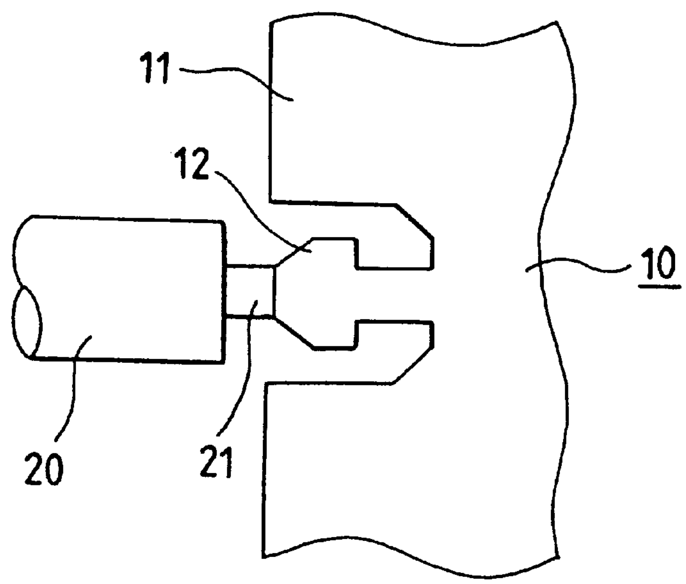

One preferred embodiment will be described below in detail with reference to the accompanying drawings. FIGS. 1(A) and 1(B) are side views of the shield casing according to the present invention, and FIGS. 2(A) and 2(B) are plan views thereof. FIG. 1(A) shows the shield casing only, and FIG. 1(B) shows a state where a cable is combined with the shield casing. Similarly, FIG. 2(A) shows the shield casing only, and FIG. 2(B) shows a state where the cable is combined with the shield casing. In the figures, reference numeral 11 denotes a metal shield casing body adapted to cover a printed circuit board 30; 13, a cable introduction hole formed in a Aide wall 14 of the casing body 11; and 15, a contact piece which is perpendicularly extended towards the cable introduction hole 13 from the top portion 16 of the casing body 11. The contact piece 15 is soldered to a cable 20 which is introduced into the cable introduction hole 13 in parallel with the top portion 16.

The cable 20 is a coaxial cable. The contact piece 15 has an arcuate notch 17 which is along the outer cylindrical surface of the coaxial cable 20, so that the contact piece 15 is welded to the grounded part 21 of the coaxial cable 20 by soldering. Reference numeral 43 denotes a solder.

The contact piece 15 is formed at the position which is retracted from the side wall 14 of the casing body 11. Hence, the solder 43, which connects the grounded part 21 to the contact piece 15, does not stick out of the casing body 11.

Figure 4A:
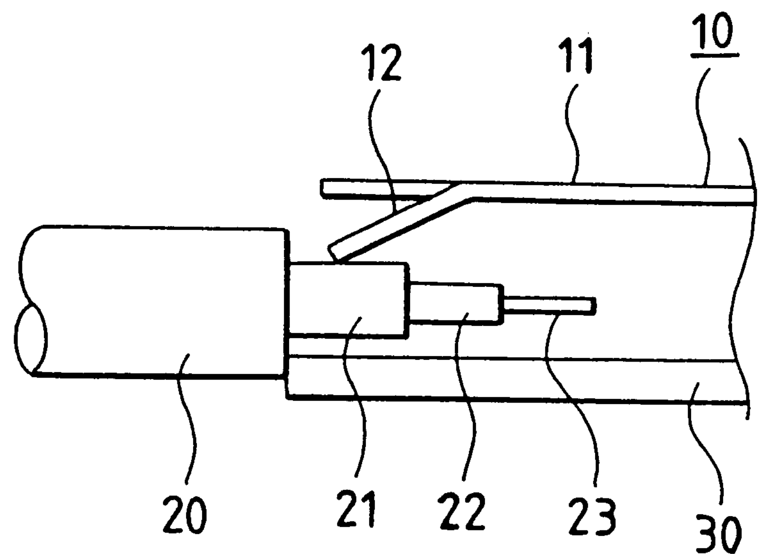
FIGS. 4(A) and 4(B) are sectional side views of the conventional shield casing shown in FIGS. 3(A) and 3(B).
Figure 4B:
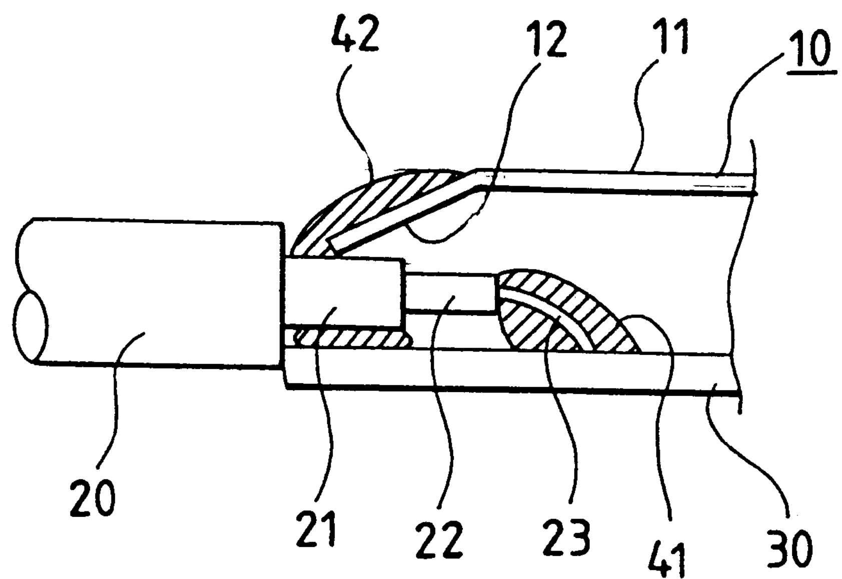

Although it is not shown in the figure, soldering of the central electrically conductive of the coaxial cable 20 to the conductor pattern of the printed circuit board 30 is carried out similarly as in the case of FIG. 4(B).

As has been described heretofore, according to the shield casing of the present invention, the soldering contact piece is formed at the same time when the shield casing body is formed by punching. It is unnecessary to bend this contact piece in a proper angle at the time of soldering.

Furthermore, according to the shield casing of the present invention, the shielding solder does not stick out of the casing.

The present invention provides many advantages over the prior art, including FIGS. 3A–4B. Specifically, the solder is capable of providing a more robust mechanical connection between the contact piece 15 and the cable 20. This is because the contact piece 15 is positioned at a substantial perpendicular angle with respect to the top of the casing, and the contact piece 15 (with its arcuate notch) does not contact the cable when the cable 20 is inserted within the casing. This latter feature ensures that there are no undue stresses or forces placed on either of the cable 20 or the solder connecting the cable 20 and the contact piece 15. Also, manufacturing costs are reduced considerably because the contact piece 15 can be bent downwards prior to the cable 20 being inserted within the casing.

What is claimed is:

1. A shield casing comprising:

a metal shield casing body covering a circuit board to which an electrical cable is connected, the shield casing body including a top portion, side walls and an opened bottom portion;

a cable introduction portion formed by partly notching one of the side walls, the electrical cable being introduced into the cable introduction portion in parallel with the top portion; and a contact piece extending perpendicularly from the top portion towards the bottom portion and positioned above the cable introduction portion, the electrical cable being connected to the contact piece by use of solder.

2. The shield casing as set forth in claim 1, wherein an arcuate notch is formed at an end portion of the contact piece so as to be along an outer surface of the electrical cable.

3. The shield casing as set forth in claim 1, wherein the contact piece is positioned inwards into the shield casing than an outer face of the side wall in which the cable introduction portion is formed.

4. The shield casing as set forth in claim 1, wherein the contact piece does not move relative to the shield casing body subsequent to the electrical cable being placed therein.

5. The shield casing as set forth in claim 1, wherein the perpendicularly oriented contact piece allows the electrical cable to be welded on the contact piece such that an upper surface of the solder is lower than or a same height as the top portion of the shield casing body.

6. The shield casing as set forth in claim 2, wherein the contact piece is perpendicularly oriented prior to the electrical cable being introduced into the shield casing body, and the arcuate notch formed at the end portion of the contact piece permits the introduction of the electrical cable into the shield casing body beyond one of the side walls.

7. The shield casing as set forth in claim 2, wherein an outer circumferential shape of the electrical cable and a circumferential shape of the arcuate notch formed at the end portion of the contact piece have a same shape.

8. The shield casing as set forth in claim 2, wherein a gap is formed between the outer diameter of the electrical cable and the arcuate notch when the electrical cable is introduced into the shield casing body.

9. The shield casing as set forth in claim 8, wherein the solder which welds the electrical cable on the contact piece is positioned within and over the gap.

10. The shield casing as set forth in clam 1, wherein the contact piece is formed at a position which is retracted from one of the side walls of the shield casing body whereby the soldering which connects the electrical cable to the contact piece does not stick out of the shield casing body.

* * * * *